United States Patent
Yoo et al.

(10) Patent No.: US 6,649,502 B2
(45) Date of Patent: Nov. 18, 2003

(54) METHODS OF FORMING MULTILAYER DIELECTRIC REGIONS USING VARIED DEPOSITION PARAMETERS

(75) Inventors: Cha-young Yoo, Kyungki-do (KR); Han-jin Lim, Seoul (KR); Wan-don Kim, Kyungki-do (KR); Se-jin Lee, Kyungki-do (KR); Soon-yeon Park, Daeku (KR); Yong-kuk Jeong, Kyongsangbuk-do (KR); Han-mei Choi, Kyungki-do (KR); Gyung-hoon Hong, Kyungki-do (KR); Seok-jun Won, Seoul (KR)

(73) Assignee: Samsung Electronics Co., Ltd. (KR)

( * ) Notice: Subject to any disclaimer, the term of this patent is extended or adjusted under 35 U.S.C. 154(b) by 136 days.

(21) Appl. No.: 09/859,168

(22) Filed: May 16, 2001

(65) Prior Publication Data

US 2002/0013041 A1 Jan. 31, 2002

(30) Foreign Application Priority Data

May 16, 2000 (KR) .......................................... 2000-26083
Mar. 16, 2001 (KR) .......................................... 2001-13751

(51) Int. Cl.$^7$ ................. H01L 21/3205; H01L 21/4763
(52) U.S. Cl. ...................... 438/586; 438/585; 438/587; 438/393; 438/396; 438/785
(58) Field of Search ................................ 438/586, 240, 438/250, 346, 393, 785

(56) References Cited

U.S. PATENT DOCUMENTS 6,207,489 B1 * 3/2001 Nam et al. .................. 438/240
6,218,260 B1   4/2001 Lee et al. ................... 438/398

* cited by examiner

Primary Examiner—David Nelms
Assistant Examiner—Reneé R Berry
(74) Attorney, Agent, or Firm—Myers Bigel Sibley & Sajovec

(57) ABSTRACT

A dielectric region for a device such as a memory cell capacitor is formed by depositing a metal oxide, such as tantalum oxide, on a substrate at a first deposition rate in a first atmosphere maintained within a first temperature range and a first pressure range that produce a first tantalum oxide layer with a desirable step coverage. Metal oxide is subsequently deposited on the first metal oxide layer in a second atmosphere maintained within a second temperature range and a second pressure range that produce a second deposition rate greater than the first deposition rate to form a second tantalum oxide layer on the first tantalum oxide layer. For example, the first atmosphere may be maintained at a temperature in a range from about 350° C. to about 460° C. and a pressure in a range from about 0.01 Torr to about 2.0 Torr during formation of a first tantalum oxide layer, and the second atmosphere may be maintained at a temperature in a range from about 400° C. to about 500° C. and a pressure in a range from about 0.1 Torr to about 10.0 Torr during formation of a second tantalum oxide layer.

44 Claims, 14 Drawing Sheets

10A+140A
(0.2+0.4Torr)

30A+120A
(0.2+0.4Torr)

50A+100A
(0.2+0.4Torr)

METHODS OF FORMING MULTILAYER DIELECTRIC REGIONS USING VARIED DEPOSITION PARAMETERS

PRIORITY CLAIM

This application claims the benefit under 35 U.S.C. §119 of Korean Patent Application No. 2000-26083, filed on May 16, 2000, and Korean Patent Application No. 2002-13751, filed on Mar. 16, 2001, each of which is hereby incorporated by reference in its entirety.

FIELD OF THE INVENTION

The present invention relates to methods for forming dielectric regions for microelectronic devices, and more particularly, to methods for forming dielectric regions for devices such as memory cell capacitors.

BACKGROUND OF THE INVENTION

As semiconductor memory devices become increasingly integrated, the memory cells in such devices generally have become smaller. Thus, for example, areas for capacitors and transistors used in such memory cells have decreased. This decreased size can degrade storage capacity.

Accordingly, new capacitor structures have been introduced. Traditionally, storage capacitors commonly employed a stack structure but, in order to secure a sufficient capacity in a limited area, steric structures such as fin structures, cylinder structures and trench structures have been recently used. A capacitor having such a steric structure may have relatively large electrodes in comparison to those of a traditional stacked structure and, therefore, can have relatively larger storage capacitance.

Another technique for increasing storage capacitance of a capacitor is the use of a capacitor dielectric with increased dielectric constant, which can allow the size of dielectric region to be reduced. For example, recently developed devices include dielectrics formed of a metal oxide, such as tantalum oxide ($Ta_2O_5$) or aluminum oxide ($Al_2O_3$), or a ferroelectric material, such as material from a perovskite series, e.g., strontium titanate (ST) or barium strontium titanate (BST).

Tantalum oxide is larger in dielectric constant than silicon dioxide ($SiO_2$) or silicon nitride ($Si_3N_4$). In particular, tantalum oxide has a dielectric constant of 24, while $SiO_2$ and $Si_3N_4$ have dielectric constants of 3.9 and 7.8, respectively. Thus, a relatively thinner dielectric layer may be used in a capacitor with a tantalum oxide dielectric. However, a tantalum oxide layer also generally has a smaller energy band gap than a silicon oxide layer or a nitride oxide layer and, therefore, may exhibit a higher leakage current.

FIG. 1A is a flow chart illustrating a process for manufacturing a conventional capacitor using a tantalum oxide dielectric layer. The tantalum oxide layer is formed through two deposition processes and two annealing processes. As shown in FIG. 1A, a lower capacitor electrode is formed on a semiconductor substrate (step 100). The lower electrode is made of impurity-doped polycrystalline silicon. A first tantalum oxide layer is deposited on the lower capacitor electrode using a chemical vapor deposition (CVD) technique at a temperature of about 460° C. to 500° C. and a pressure of about 3.0 Torr to 5.0 Torr (step 102). Preferably, the first tantalum oxide layer has a thickness of about 10 Å to about 50 Å. Thereafter, the first tantalum oxide layer undergoes a first annealing process in an ultraviolet-ozone atmosphere (step 104). Subsequently, a second tantalum oxide layer is deposited in a thickness of about 50 Å to about 100 Å under the same deposition atmosphere as the first tantalum oxide layer (step 106). Thereafter, the second tantalum oxide layer undergoes a second annealing process in an ultraviolet-ozone atmosphere (step 108). Finally, an upper capacitor electrode is deposited on the second tantalum oxide layer (step 110). The deposition process of the first tantalum oxide layer, the first annealing process, the deposition process of the second tantalum oxide layer and the second annealing process can be performed in-situ.

FIG. 1B is a graph illustrating process time with respect to temperature and pressure for a capacitor fabrication process. The vertical axis denotes temperature or pressure, and the horizontal axis denotes a time period. As shown in FIG. 1B, when first and second tantalum oxide layers are deposited as described above, a time period required for depositing the first tantalum oxide layer is 214 seconds, and a time period for depositing the second tantalum oxide layer is 239 seconds. Time for each of the first and second annealing processes is 200 seconds.

When a lower capacitor electrode of a capacitor is made of a metal, such as titanium nitride (TiN), ruthenium (Ru) or platinum (Pt), the storage capacitance of a capacitor may significantly increase in comparison to a capacitor using a polycrystalline silicon layer as a lower capacitor electrode. However, when the lower capacitor electrode is made of a metal, such as ruthenium, step coverage characteristics of a tantalum oxide layer may greatly depend on deposition pressure and/or deposition temperature. For example, when a tantalum oxide layer is deposited on a polycrystalline silicon layer at a pressure of 0.1 Torr to several Torr using a low-pressure chemical vapor deposition (LPCVD) technique, variation of a step coverage of the tantalum oxide layer with deposition pressure may be very small. However, when a tantalum oxide layer is deposited on a metal layer, such as a ruthenium layer, increased deposition pressure tends to deteriorate step coverage of the tantalum oxide layer. This is because a sticking coefficient between the capacitor lower electrode and the tantalum oxide layer differs depending on the material composition of the lower capacitor electrode. Therefore, in order to use a metal layer, such as a ruthenium layer, as a capacitor lower electrode, it is desirable to deposit a tantalum oxide dielectric layer on the metal layer at a sufficiently low temperature and a sufficiently low pressure to prevent deterioration of step coverage of the tantalum oxide layer. However, due to a low deposition pressure, this can reduce manufacturing throughput.

FIG. 9A is a cross-sectional view illustrating a metal layer formed on a metal oxide layer (i.e., tantalum oxide layer) according to a conventional process. A ruthenium layer 91 is deposited on a semiconductor substrate 90 to a predetermined thickness. Thereafter, a tantalum oxide layer is formed on the ruthenium layer 91 such that first and second deposition layers 92-1, layers 92-2 made of $Ta_2O_5$ are sequentially deposited.

However, when the first tantalum oxide layer layers 92-1 is deposited at a high temperature and in a high pressure, step coverage of the ruthenium layer 91 may be deteriorated. This can also decrease step coverage of the second tantalum oxide layer layers 92-1. This is because the initial deposition layer layers 92-1 may have a relatively large sticking coefficient and may be deposited such that impurities, such as carbon, are not satisfactorily decomposed. Deposition at lower temperature and lower pressure could be performed to improve a step coverage of the tantalum oxide layer.

However, low temperature and pressure may reduce deposition rate (i.e., deposition speed) of the tantalum oxide layer, leading to a low manufacturing throughput.

For the foregoing reasons, there is a need for a method of depositing a metal oxide layer of a semiconductor capacitor that can improve both a step coverage and a manufacturing throughput.

SUMMARY OF THE INVENTION

According to some embodiments of the present invention, a dielectric region, such as a dielectric region for a storage capacitor of a memory cell, is fabricated by depositing tantalum oxide on a substrate to a thickness of about 1 Å or greater in an atmosphere having a temperature in a range from about 350° C. to about 460° C. and a pressure in a range from about 0.01 Torr to about 2.0 Torr to form a first tantalum oxide layer. Tantalum oxide is subsequently deposited on the first tantalum oxide layer to a thickness of about 30 Å or greater in an atmosphere having a temperature in a range from about 400° C. to about 500° C. and a pressure in a range from about 0.1 Torr to about 10.0 Torr to form a second tantalum oxide layer on the first tantalum oxide layer. The first tantalum oxide layer may be deposited on a conductive layer, for example, a polycrystalline silicon layer or a metal layer, such as a ruthenium, platinum or titanium layer. The first and second tantalum oxide layers may be annealed after formation.

In some embodiments of the present invention, tantalum oxide is deposited on a substrate to a thickness of about 10 Å or greater in an atmosphere having a temperature in a range from about 420° C. to about 460° C. and a pressure in a range from about 0.3 Torr to about 2.0 Torr to form a first tantalum oxide layer. Tantalum oxide is subsequently deposited on the first tantalum oxide layer to a thickness of about 50 Å or greater in an atmosphere having a temperature in a range from about 460° C. to about 500° C. and a pressure in a range from about 3.0 Torr to about 5.0 Torr to form a second tantalum oxide layer. The first tantalum oxide layer may be formed to a thickness in a range from about 10 Å to about 50 Å, and the second tantalum oxide layer may be formed to a thickness in a range from about 50 Å to about 100 Å.

In other embodiments of the present invention, tantalum oxide is deposited on a substrate to a thickness of about 1 Å or greater in an atmosphere having a temperature in a range from about 350° C. to about 450° C. and a pressure in a range from about 0.01 Torr to about 2.0 Torr to form a first tantalum oxide layer. Tantalum oxide is subsequently deposited on the first tantalum oxide layer to a thickness of about 30 Å or greater in an atmosphere having a temperature in a range from about 400° C. to about 500° C. and a pressure in a range from about 0.1 Torr to about 10.0 Torr to form a second tantalum oxide layer. The first tantalum oxide layer may have a thickness in a range from about 1 Å to about 100 Å, and the second tantalum oxide layer may have a thickness in a range from about 30 Å to about 300 Å.

According to other aspects of the present invention, a dielectric region is formed by depositing tantalum oxide on a substrate at a first deposition rate to a thickness of about 1 Å or greater in a first atmosphere maintained within a first temperature range and a first pressure range that produce a first tantalum oxide layer having a step coverage that is not less than 90 percent. Tantalum oxide is subsequently deposited on the first tantalum oxide layer in a second atmosphere maintained within a second temperature range and a second pressure range that produce a second deposition rate greater than the first deposition rate to form a second tantalum oxide layer on the first tantalum oxide layer. For example, the first atmosphere may be maintained at a temperature in a range from about 350° C. to about 460° C. and a pressure in a range from about 0.01 Torr to about 2.0 Torr during formation of the first tantalum oxide layer, and the second atmosphere may be maintained at a temperature in a range from about 400° C. to about 500° C. and a pressure in a range from about 0.1 Torr to about 10.0 Torr during formation of the second tantalum oxide layer.

In yet other embodiments of the present invention, a metal oxide layer is formed. A lower layer is formed on a substrate. A first metal oxide layer is deposited on the lower layer in an atmosphere having a first deposition temperature and a first deposition pressure. A second metal oxide layer is deposited on the first oxide layer in an atmosphere having a second deposition temperature and a second deposition pressure. The second temperature is higher than the first deposition temperature, or the second deposition pressure is higher than the first deposition pressure.

In other embodiments, a metal layer is formed on a semiconductor substrate. A seed layer is formed on the metal layer in an atmosphere of a low temperature and a low pressure. A tantalum oxide layer is formed along the seed layer in an atmosphere of a high temperature and a high pressure.

In other embodiments, a semiconductor capacitor is formed by forming a lower electrode on a semiconductor substrate. A first tantalum oxide layer is subsequently deposited on the lower electrode in an atmosphere of a first temperature or a first pressure. A second tantalum oxide layer is subsequently deposited on the first tantalum oxide layer in an atmosphere of a second temperature or a second pressure, wherein the second temperature higher than the first temperature, or the second pressure higher than the first pressure. An upper electrode is formed on the second tantalum oxide layer.

DETAILED DESCRIPTION

Figure 1A:
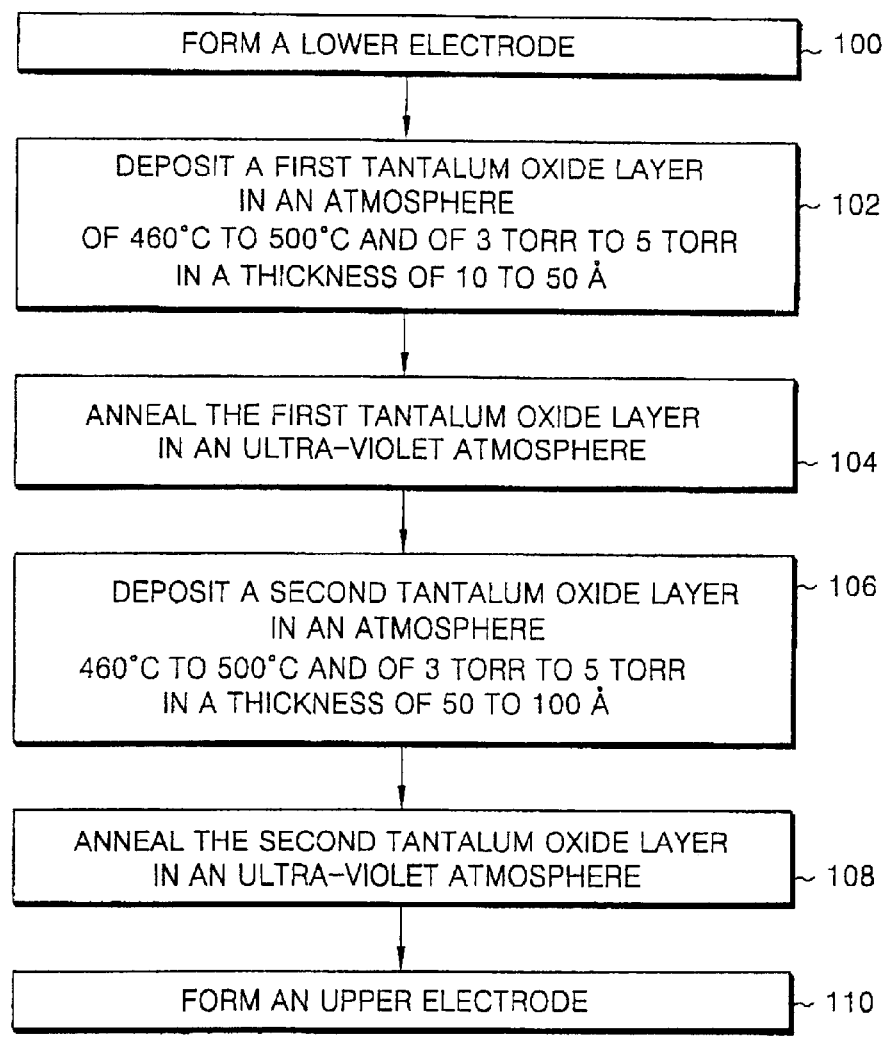
FIG. 1A is a flow chart illustrating a conventional process for fabricating a capacitor using a tantalum oxide layer as a capacitor dielectric.
Figure 1B:
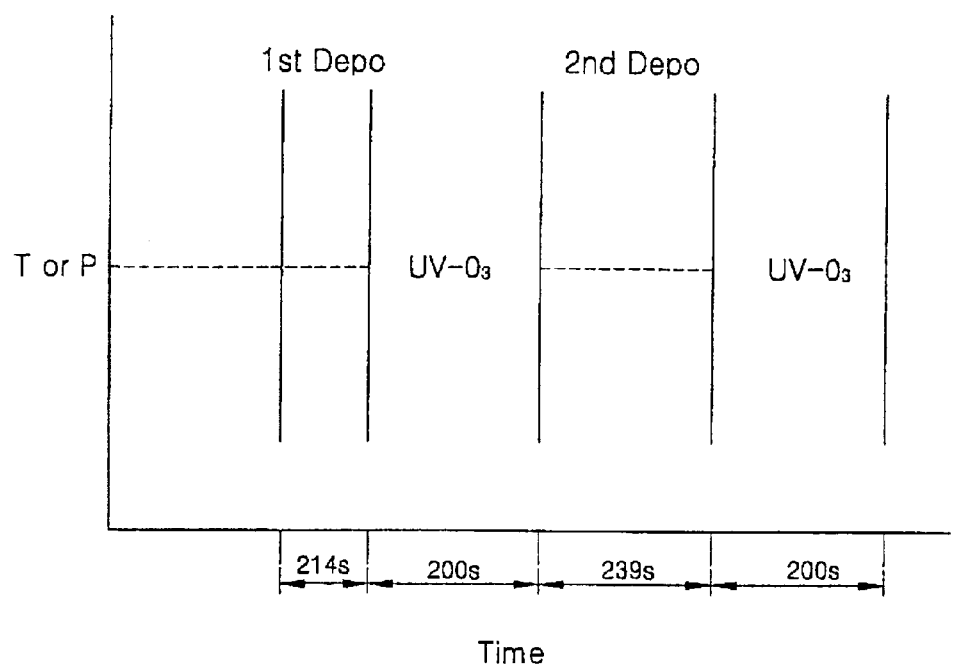
FIG. 1B is a graph illustrating process time with respect to deposition temperature and deposition pressure for a conventional capacitor fabrication process.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2A:
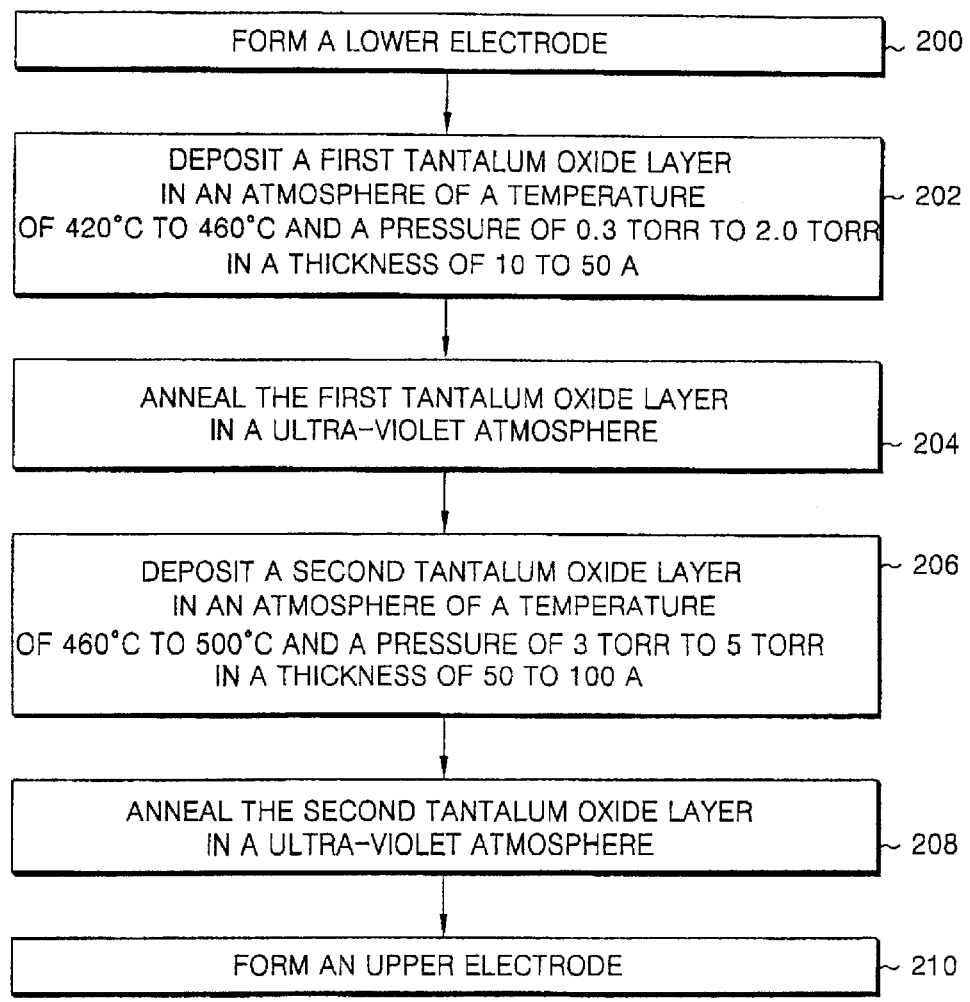
FIG. 2A is a flow chart illustrating operations for fabricating a capacitor according to embodiments of the present invention.

FIG. 2A is a flow chart illustrating a process of manufacturing a capacitor using a metal oxide layer as a capacitor dielectric layer according to embodiments of the present invention. As shown in FIG. 2A, an impurity-doped polycrystalline silicon layer that serves as a lower capacitor electrode is formed on a semiconductor substrate (step 200). A first tantalum oxide layer is formed on the lower capacitor electrode using a chemical vapor deposition (CVD) process at a first temperature and a first pressure (step 202). In particular, the first tantalum oxide layer may have a thickness of about 10 Å to about 50 Å. The first tantalum oxide layer may be deposited at a relatively low temperature, e.g., at a temperature in a range between about 420° C. and about 460° C., and/or the first tantalum oxide layer may also be deposited at a relatively low pressure, e.g., a pressure in a range between about 0.3 Torr and about 3 Torr. This can provide desirable step coverage.

A first annealing process is then performed in an ultraviolet-ozone atmosphere (step 204). This can supply oxygen to the first tantalum oxide layer and may, thus, improve surface quality of the first tantalum oxide layer. The deposition process and the subsequent annealing process may be performed in-situ.

Thereafter, a second tantalum oxide layer is deposited on the first tantalum oxide layer at a higher temperature and a high pressure (step 206), preferably, to a thickness of about 50 Å to about 100 Å. For example, the second tantalum oxide layer may be formed under conventional deposition conditions, e.g., at a temperature in a range from 460° C. to 500° C. and a pressure in a range from 3.0 Torr to 5 Torr.

A second annealing process is then performed in an ultraviolet-ozone atmosphere (step 208). The second deposition process and the second annealing process can be performed in-situ. Thereafter, an upper capacitor electrode may be formed on the second tantalum oxide layer (step 210).

Figure 2B:
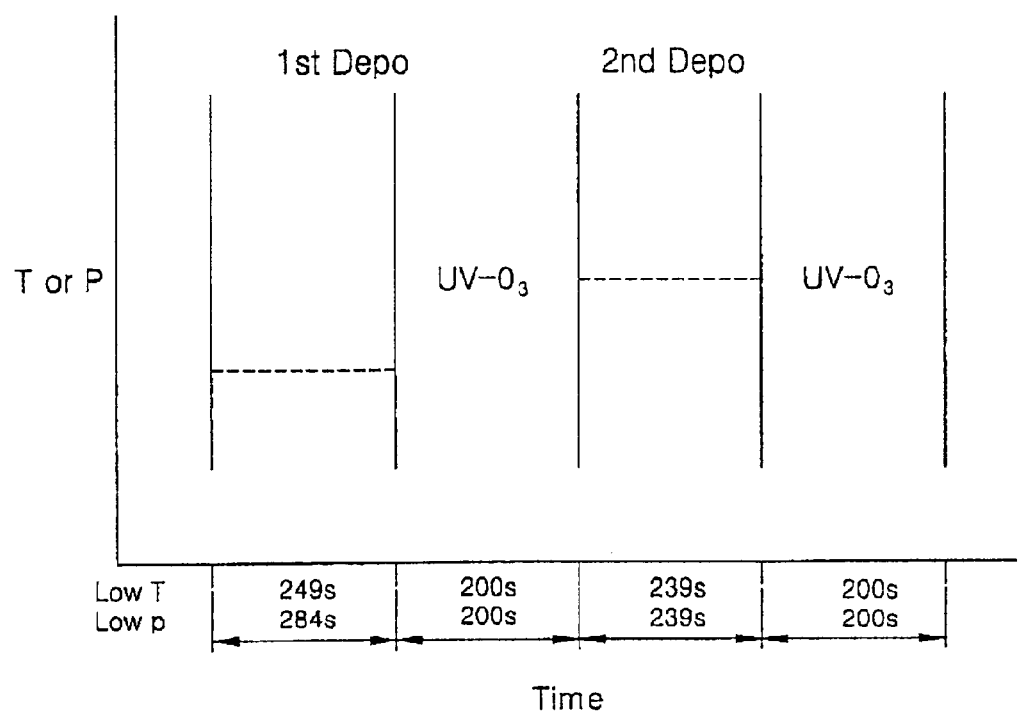
FIG. 2B is a graph illustrating process time vs. deposition temperature and deposition pressure for a capacitor dielectric fabrication process according to embodiments of the present invention.

FIG. 2B is a graph illustrating a deposition temperature and a deposition pressure with respect to time in a dielectric layer fabrication process according to embodiments of the present invention, with the vertical axis denoting deposition temperature and deposition pressure and the horizontal axis denoting time. As shown in FIG. 2B, a time period for depositing the first tantalum oxide layer to the desired thickness at the above-described "low" temperature is 249 seconds. A time period for depositing the first tantalum oxide layer to the desired thickness at the above-described "low" pressure is 284 seconds. A time period for depositing the second tantalum oxide layer to the desired thickness in a conventional atmosphere is 239 seconds. Time for each of the first and second annealing processes is 200 seconds.

Figure 3:
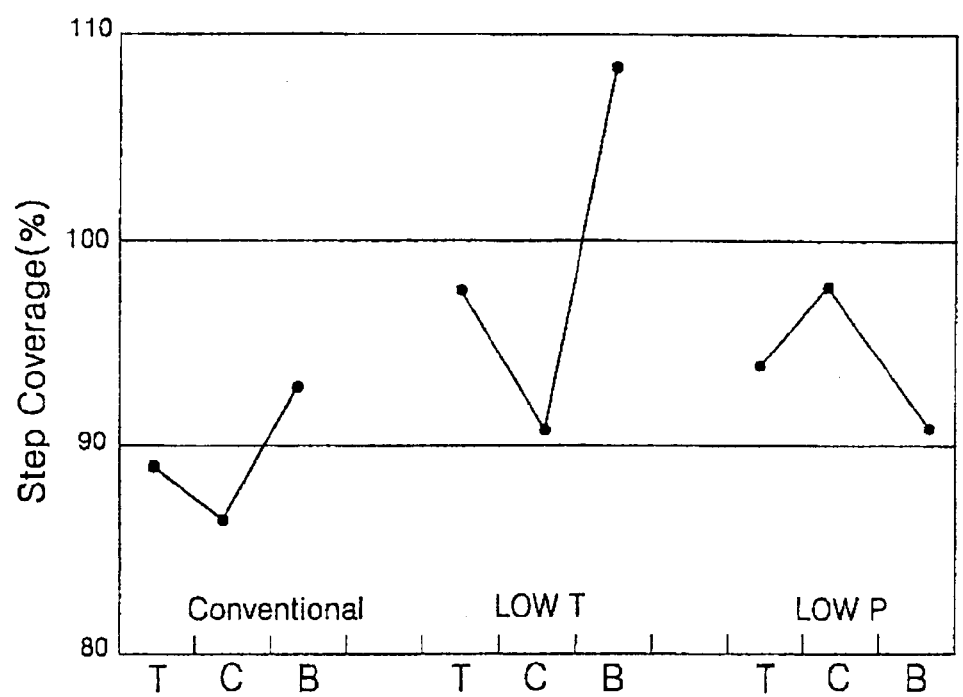
FIG. 3 is a graph illustrating step coverage with respect to deposition parameters for a tantalum oxide layer.

FIG. 3 is a graph illustrating step coverage with respect to deposition condition of a first tantalum oxide layer as described above. In the graph of FIG. 3, the vertical axis denotes step coverage, and the horizontal axis denotes deposition condition, e.g., temperature or pressure. An indication "conventional" represents that the first and second tantalum oxide layers are both deposited in a conventional atmosphere. "Low T" indicates that that the first tantalum oxide layer is deposited at a low temperature and the second tantalum oxide layer is deposited at a conventional temperature and pressure. "Low P" indicates that the first tantalum oxide layer is deposited at a low pressure and the second tantalum oxide layer is deposited at a conventional temperature and pressure. "T", "C" and "B" on the horizontal axis refer to "top," "central," and "bottom" portions, respectively, of the deposited first tantalum oxide layer.

As shown in FIG. 3, when the first tantalum oxide layer is deposited at a relatively low temperature of about 420° C. to about 460° C., step coverage may improve as much as 5%. When the first tantalum oxide layer is deposited at a relatively low pressure of about 0.3 Torr to about 3 Torr, step coverage may improve even more.

Figure 4:
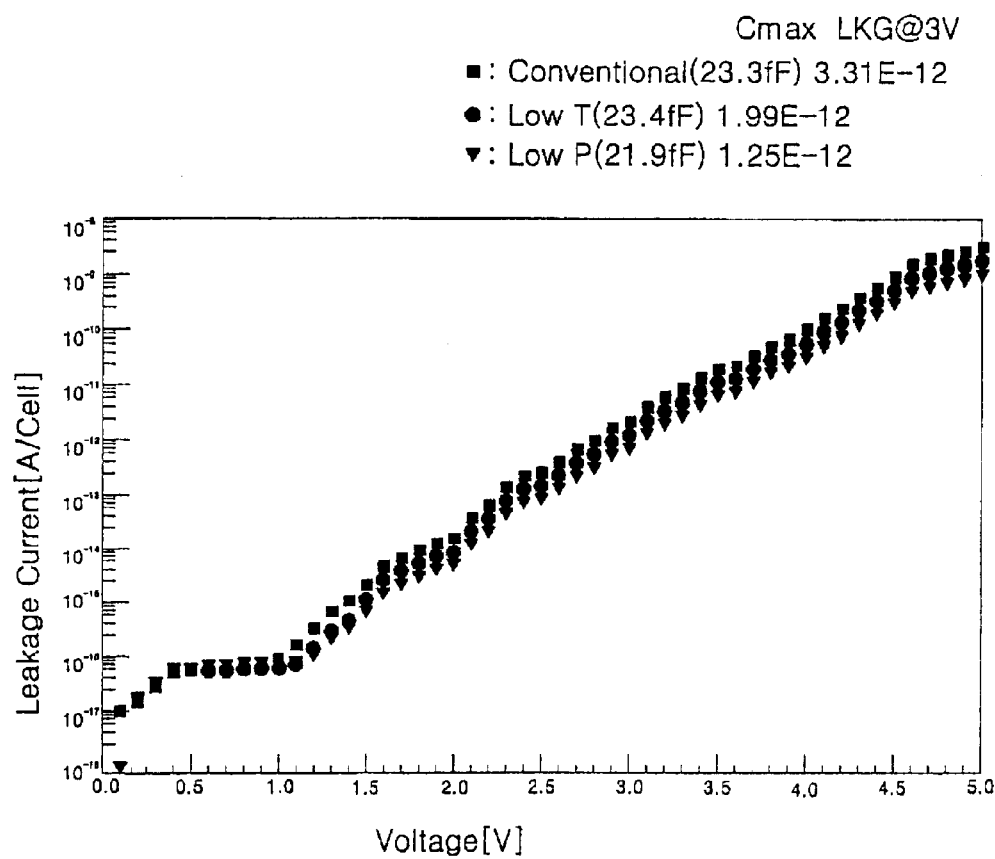
FIG. 4 is a graph illustrating leakage current with respect to voltage for tantalum oxide capacitor dielectrics formed according to embodiments of the present invention in comparison to conventionally formed dielectrics.

FIG. 4 is a graph illustrating leakage current with respect to voltage for a tantalum oxide capacitor dielectric layer. In the graph of FIG. 4, the vertical axis denotes leakage current, and the horizontal axis denotes voltage. As shown in FIG. 4, capacitance for tantalum oxide layers formed in the "conventional" manner is 23.3 femtoFarads (fF). In contrast, capacitance for layers formed in the "low T" fashion is 23.4 fF, and capacitance for layers formed in the "low P" manner is 21.9 fF. In other words, capacitances for dielectrics formed according to embodiments of the present invention are nearly the same as for dielectrics formed using conventional techniques. However, leakage current for a dielectric formed in the "conventional" manner may be higher than leakage currents for the "low T" and "low P" processes according to the present invention.

Figure 5:
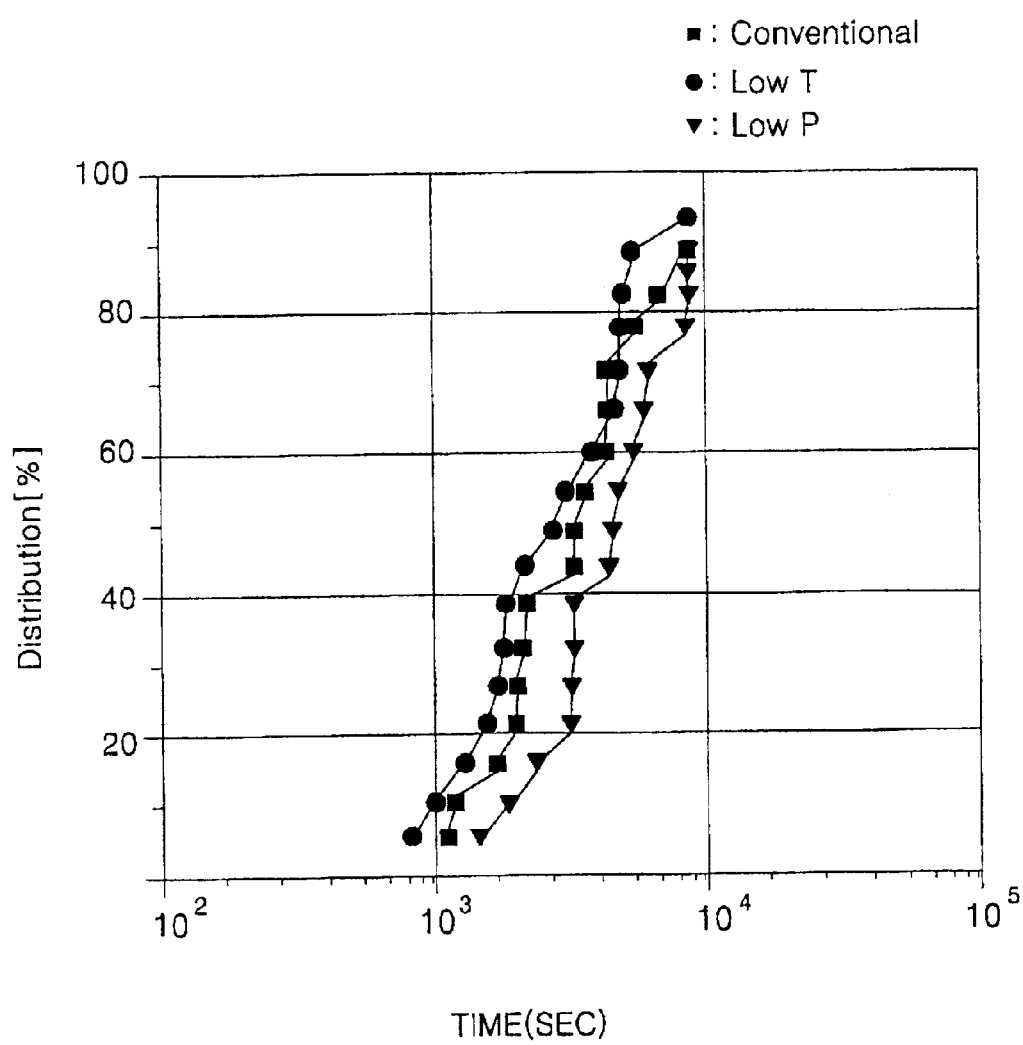
FIG. 5 is a graph illustrating breakdown distributions for tantalum oxide capacitor dielectrics formed according to embodiments of the present invention in comparison to conventionally formed dielectrics.

FIG. 5 is a graph illustrating a breakdown distribution at five volts for tantalum oxide dielectrics formed according to the prior art in comparison to tantalum oxide dielectrics formed according to embodiments of the present invention. As time passes, the dielectric breakdown distribution of the dielectrics increases. As shown, there is little difference in a breakdown distribution between dielectrics formed using the "low T" process according to embodiments of the present invention and dielectrics formed using the conventional process. However, the dielectric breakdown distribution of about 50% for dielectrics formed according to the "low P" process may occur as much as 1000 second later than conventionally formed dielectrics.

Figure 6:
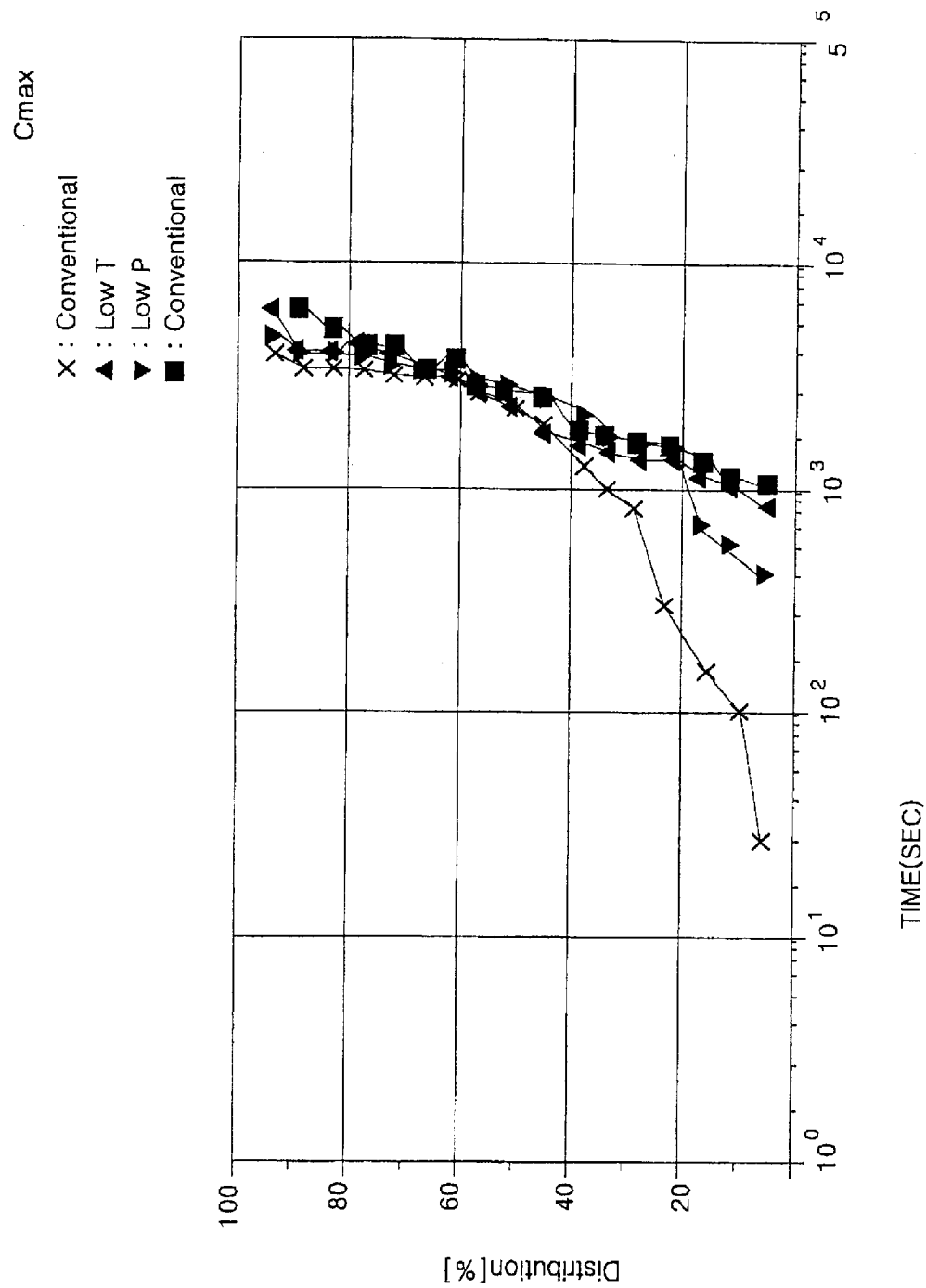
FIG. 6 is a graph illustrating breakdown distributions with respect to deposition temperature for tantalum oxide capacitor dielectrics formed according to embodiments of the present invention in comparison to conventionally formed dielectrics.

FIG. 6 is a graph illustrating a breakdown distribution with respect to deposition temperature. When first and second tantalum oxide layers are deposited under first "conventional" conditions in which low temperature and/or pressures are used for both layers, dielectric breakdown characteristics are deteriorated. However, when first and second tantalum oxide layers are deposited under "low T" conditions and/or under "low P" conditions, dielectric breakdown may be almost the same as that of layers formed using a "conventional" process using high temperatures and pressures for formation of both layers.

Figure 7A:
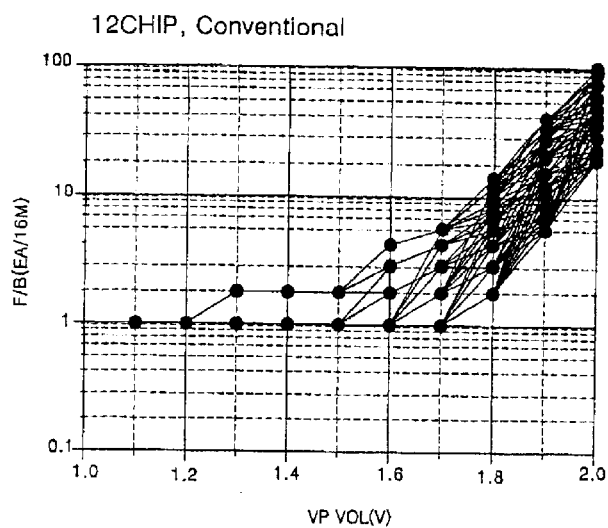
FIGS. 7A–7C are graphs illustrating failed bit number characteristics for memory cell capacitors formed according to embodiments of the present invention in comparison to conventionally formed capacitors.
Figure 7B:
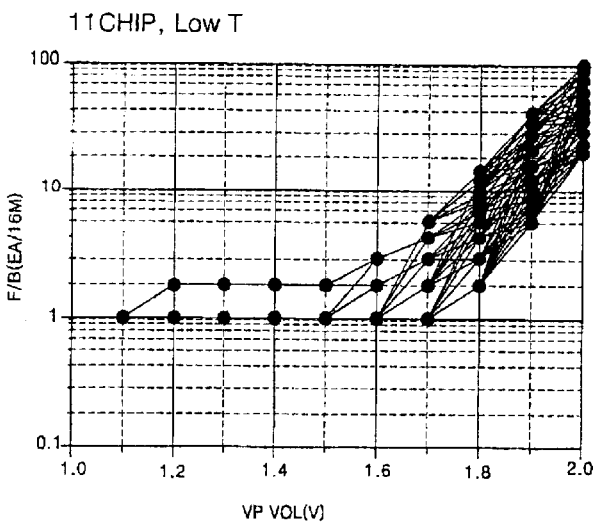
Figure 7C:
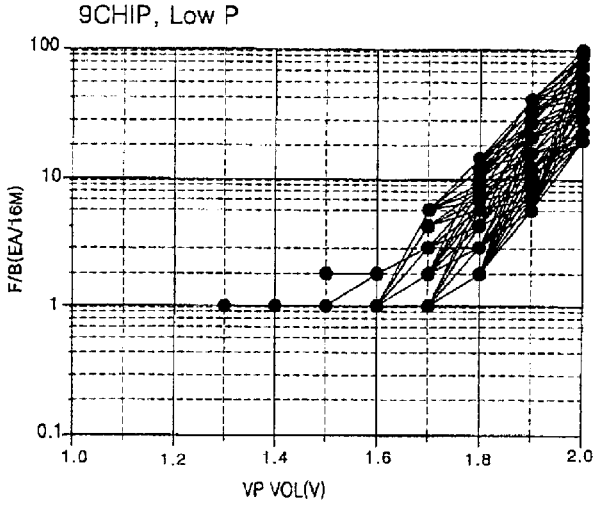

FIGS. 7A to 7C are graphs illustrating a failed bit number with respect to test voltage for capacitors using tantalum oxide dielectrics. In the graphs of FIGS. 7A to 7C, the vertical axis denotes failed bit number, and the horizontal axis denotes the test voltage $V_p$. FIG. 7A illustrates test results for twelve 16-M chips that have capacitor dielectrics formed according to a conventional process. FIG. 7B illustrates test results for eleven 16-M chips having capacitor dielectrics formed according to embodiments of the present invention using a low temperature for formation of a first metal oxide dielectric layer of a two-layer dielectric. FIG. 7C illustrates test results for eight 16-M chips having capacitor dielectrics formed according to embodiments of the present invention using a low pressure for formation of a first dielectric layer of a two-layer dielectric. As can be seen, fail bit results may be improved for capacitors having dielectrics formed according to embodiments of the present invention.

Figure 8:
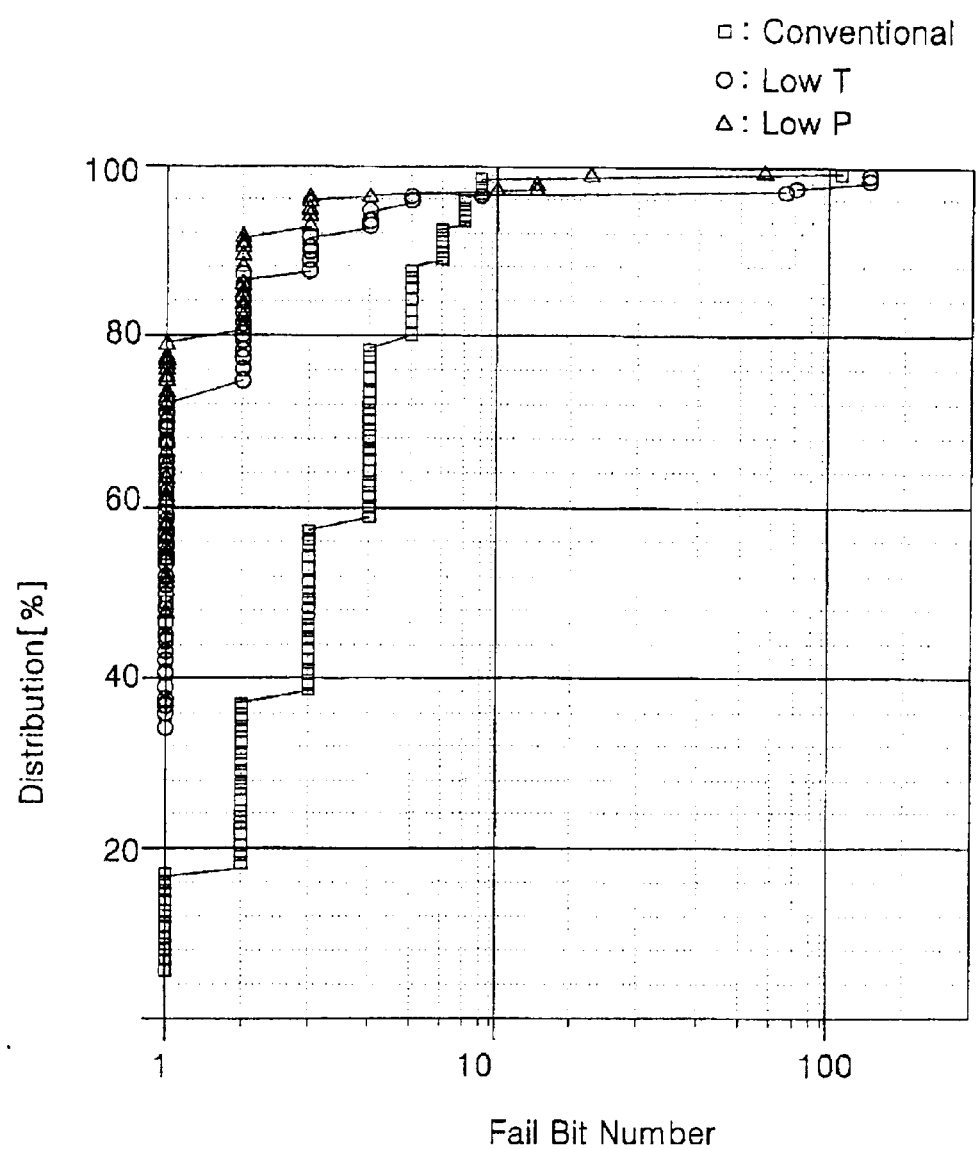
FIG. 8 is a graph illustrating fail bit distributions for memory cell capacitors formed according to embodiments of the present invention in comparison to conventionally formed memory cell capacitors.

FIG. 8 is a graph comparing fail bit distribution for conventionally formed capacitor dielectrics in comparison to capacitor dielectrics formed according to embodiments of the present invention. In FIG. 8, the vertical axis denotes fail bit distribution, and the horizontal axis denotes failed bit number per a chip. As can be seen, capacitor dielectrics formed according to embodiments of the present invention can exhibit a lower number of failed bits.

Figure 9A:
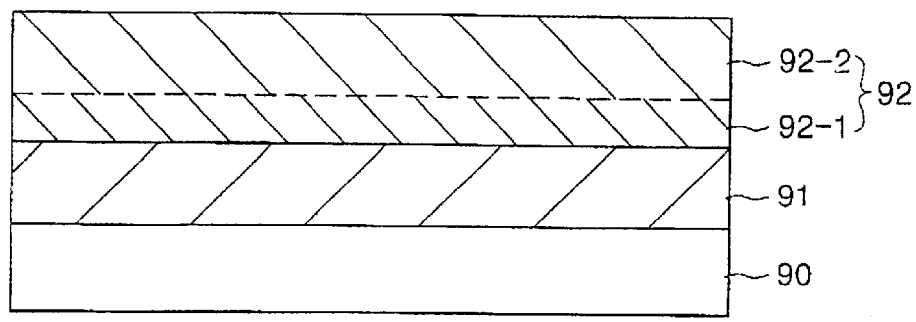
FIG. 9A is a cross-sectional view illustrating a metal oxide layer formed on a metal layer according to a conventional process.
Figure 9B:
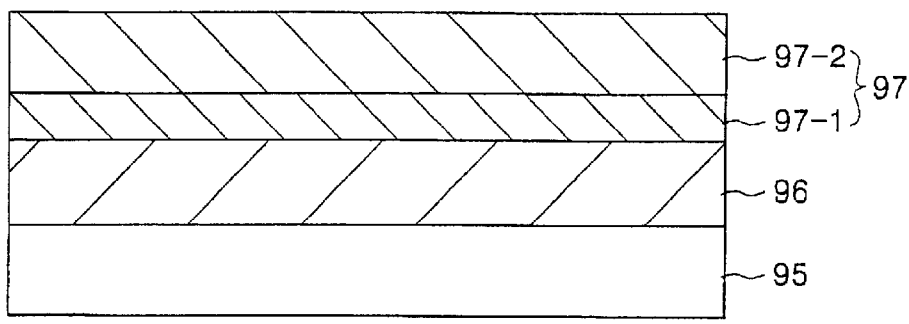
FIG. 9B is a cross-sectional view illustrating a metal oxide layer (e.g., tantalum oxide layer) formed on a metal layer according to embodiments of the present invention.

FIG. 9B is a cross-sectional view illustrating forming a metal oxide layer (e.g., tantalum oxide layer) on a metal layer according to embodiments of the present invention. A metal layer 96 is formed on a semiconductor substrate 95. The metal layer 96 may comprise, for example, Ru, Pt or TiN, and may have a single-layered or a multi-layered structure. As a seed layer, a first tantalum oxide layer 97-1 is deposited on the metal layer at low temperature in a range between about 350° C. and 450° C., and/or a low pressure in a range between about 0.01 Torr and about 2 Torr, to thickness of about 1 Å to about 100 Å. A second tantalum oxide layer 97-2 is formed on the first tantalum oxide layer 97-1 at a conventional temperature and pressure (temperature in a range between 400° C. and 500° C., and pressure in a range between about 0.1 Torr and about 10 Torr), to a thickness of about 30 to about 300 Å.

Figure 10:
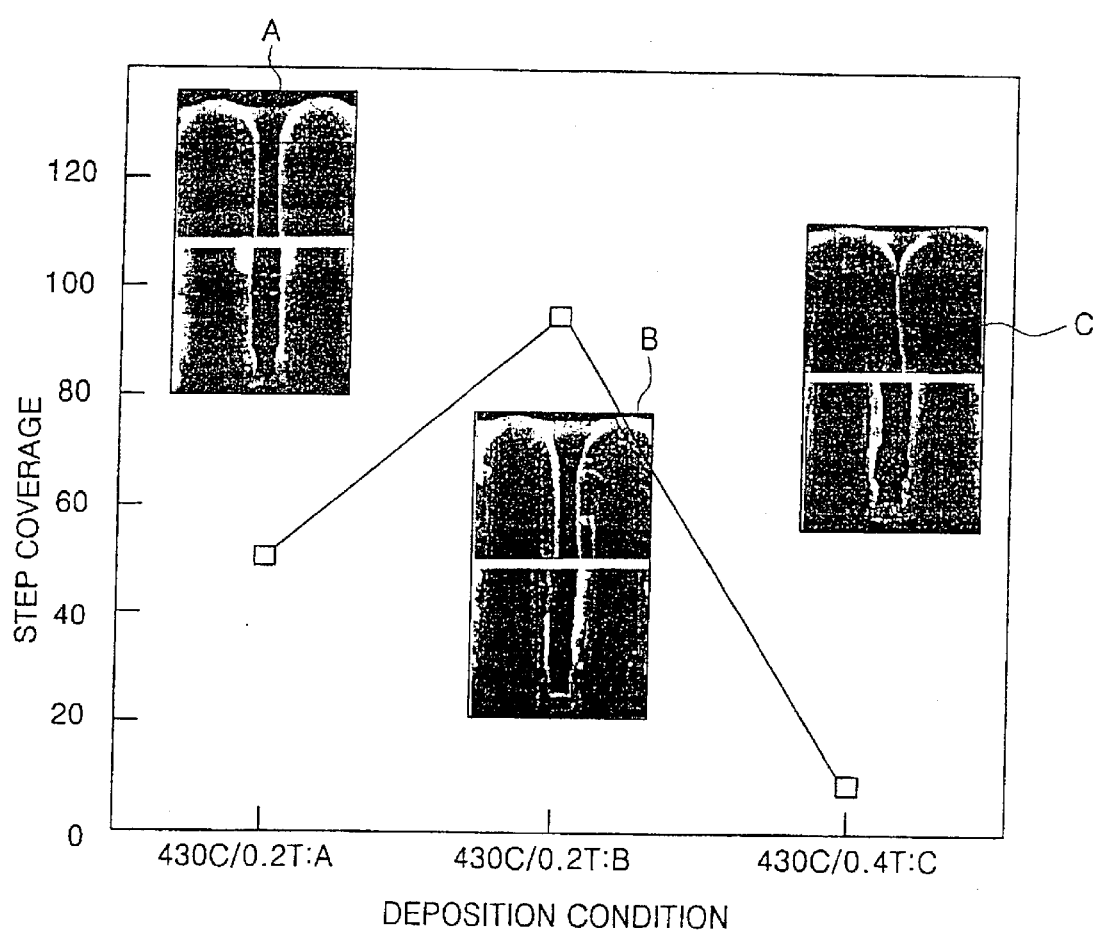
FIG. 10 is a graph illustrating step coverage with respect to deposition parameters for a tantalum oxide capacitor dielectric.

FIG. 10 illustrates step coverage with respect to a deposition atmosphere and also shows scanning electron photomicrographs illustrating step coverage characteristics for tantalum oxide layers deposited in contact holes using a nozzle type gas distribution process. The photomicrograph A shows a tantalum oxide layer that is formed at about 430° C. and about 0.2 Torr. The photomicrograph B shows a tantalum oxide layer that is formed at about 400° C. and about 0.2 Torr. The photomicrograph C shows a tantalum oxide layer that is formed at about 400° C. and about 0.4 Torr. In the photomicrographs A, B and C, the illustrated contact hole structures have a depth of about 1.1 μm, a width of about 0.15 μm, and an aspect ratio of about 7.3 to 1(i.e., 7.3:1).

As shown in the photomicrograph A, a tantalum oxide layer deposited on a metal layer in such a contact hole at about 430° C. and about 0.2 Torr exhibits a poor step coverage of about 40%. As shown in the SEM B, a tantalum oxide layer deposited on a metal layer in a contact hole at about 400° C. and about 0.2 Torr has a very good step coverage of about 90%. As shown in the SEM C, a tantalum oxide layer deposited on a metal layer in a contact hole at about 400° C. and about 0.4 Torr has a poor step coverage of about 10%. In particular, deposition thickness of the tantalum oxide layer is thicker than expected, with overhang near the top portion of the contact hole and deteriorated step coverage near the bottom of the contact hole.

Figure 11:
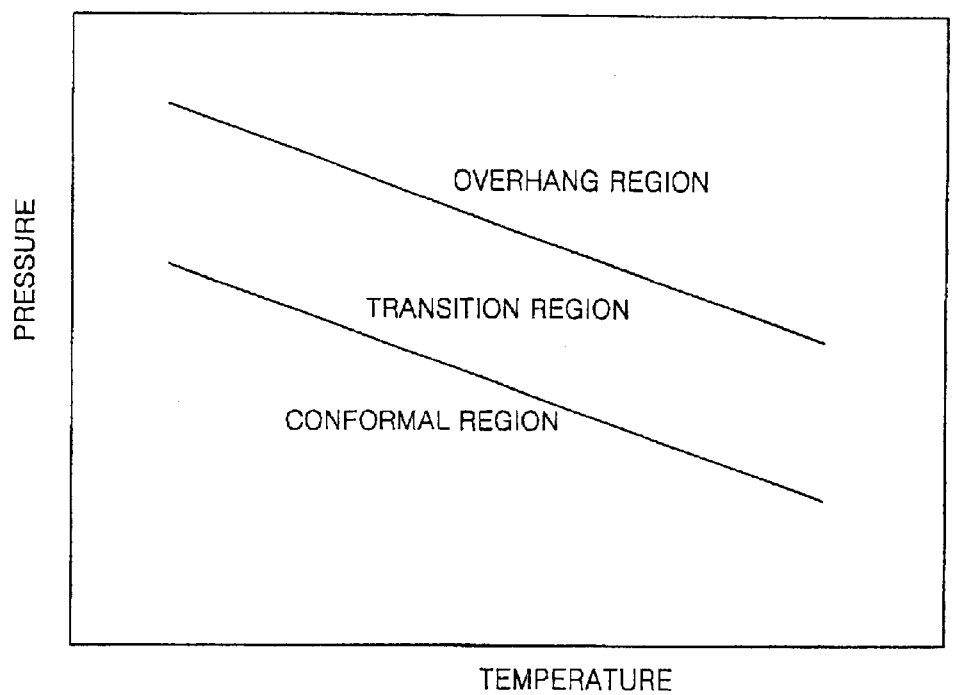
FIG. 11 is a graph illustrating deposition characteristics for tantalum oxide.

FIG. 11 is a graph illustrating step coverage behavior for tantalum oxide layers as a function of deposition pressure and deposition temperature. The graph of FIG. 11 may be applicable to a variety of deposition processes including, for example, a showerhead type gas distribution method or a nozzle type gas distribution method. As illustrated in FIG. 11, as deposition temperature becomes higher, the deposition pressure at which overhang occurs becomes lower, with a transition region being present between a conformal deposition region and the overhang region. Similarly, as deposition pressure increases, the deposition temperature at which overhang occurs becomes lower. According to embodiments of the present invention, a first tantalum oxide layer, such as the tantalum oxide layer 97-1 of FIG. 9B, is formed on a metal layer under temperature and pressure conditions falling in the conformal region of the graph of FIG. 11. A second tantalum oxide layer, such as the tantalum oxide layer 97-2 of FIG. 9B, may be deposited under conditions falling in the transitional region or the overhang region of the graph of FIG. 11, i.e., at a higher temperature and/or pressure.

Figure 12A:
FIGS. 12A–12C illustrate step coverage of a contact hole for tantalum oxide layers deposited according to embodiments of the present invention.
Figure 12B:
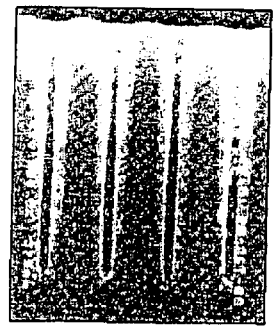
Figure 12C:
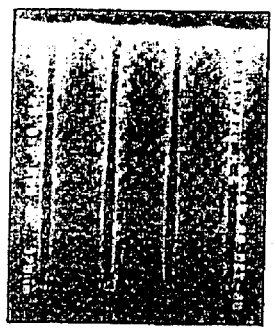

FIGS. 12A–12C are photomicrographs illustrating step coverage of a tantalum oxide layer formed in contact holes according to embodiments of the present invention. The photomicrograph of FIG. 12A shows step coverage when a first tantalum oxide layer is deposited at about 0.2 Torr to a thickness of about 10 Å, and a second tantalum oxide layer is deposited on the first tantalum oxide layer at about 0.4 Torr to a thickness of about 140 Å. As shown in FIG. 12A, little or no overhang is exhibited.

The photomicrograph of FIG. 12B shows step coverage in a contact hole when a first tantalum oxide layer is deposited at about 0.2 Torr to a thickness of about 30 Å, and a second tantalum oxide layer is deposited on the first tantalum oxide layer at about 0.4 Torr to a thickness of about 120 Å. The photomicrograph of FIG. 12C shows step coverage in a contact hole when a first tantalum oxide layer is deposited at about 0.2 Torr to a thickness of about 50 Å, and a second tantalum oxide layer is deposited on the first tantalum oxide layer at about 0.4 Torr to a thickness of about 100 Å.

Therefore, in order to improve a step coverage, a first tantalum oxide layer may be deposited in a deposition atmosphere falling in the conformal region of FIG. 11. Then, in order to increase deposition rate, a second tantalum oxide layer may be formed on the first tantalum oxide layer in an atmosphere of a higher deposition temperature than the deposition temperature of the first tantalum oxide layer and/or a higher deposition pressure than the deposition pressure of the first tantalum oxide layer. As a result, excellent step coverage and high throughput can be obtained.

Table 1 shows step coverage, deposition rate and throughput for various deposition atmospheres using a showerhead type gas distribution technique:

Table 1

| Deposition Condition | Step Coverage | Deposition Rate | Throughput |
|---|---|---|---|
| Ex 1 430° C., 0.5 Torr, 150 Å | Good | 3.85 (Å/min) | 1.5 |
| Ex 2 430° C., 3.0 Torr, 150 Å | Bad | 13.5 (Å/min) | 5.25 |
| Ex 3 First Deposition: 430° C., 0.5 Torr, 10 Å Second Deposition: 430° C., 3.0 Torr, 140 Å | Good | 10.8 (Å/min) | 4.2 |
| Ex 4 460° C, 0.5 Torr, 150 Å | Normal | 9.6 (Å/min) | 3.75 |
| Ex 5 First Deposition: 430° C., 0.5 Torr, 10 Å Second Deposition: 460° C., 3.0 Torr, 140 Å | Good | 22.2 (Å/min) | 8 |

As shown in Example 1 of Table 1, when first and second sequentially formed tantalum oxide layers are both deposited at a low deposition pressure of 0.5 Torr in order to improve a step coverage, a low throughput of 1.5 pieces per hour is obtained. In Example 2, when sequentially formed first and second tantalum oxide layers are both deposited at a high deposition pressure of 3.0 Torr, throughput is increased but step coverage deteriorates. In Example 4, when first and second sequentially formed tantalum oxide layers are both deposited at a high temperature of 460° C., step coverage and throughput may be less than desired.

However, as shown in Example 3, when a second tantalum oxide layer is deposited at a higher pressure than a previously formed first tantalum oxide layer, a higher throughput of 4.2 pieces per hour may be obtained. As shown in Example 5, when a second tantalum oxide layer is deposited at a higher temperature and a higher pressure than a previously formed first tantalum oxide layer, a high throughput of 8 pieces per hour may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a dielectric region, the method comprising:
    depositing tantalum oxide on a substrate to a thickness of about 1 Å or greater in an atmosphere having a temperature in a range from about 350° C. to about 460° C. and a first pressure to form a first tantalum oxide layer; and
    depositing tantalum oxide on the first tantalum oxide layer to a thickness of about 30 Å or greater in an atmosphere having a temperature in a range from about 400° C. to about 500° C. and a second pressure greater that the first pressure to form a second tantalum oxide layer on the first tantalum oxide layer.

2. A method according to claim 1:
    wherein depositing tantalum oxide on a substrate comprises depositing tantalum oxide on the substrate to a thickness of about 10 Å or greater in an atmosphere having a temperature in a range from about 420° C. to about 460° C. and a pressure less that 3 Torr to form the first tantalum oxide layer; and
    wherein depositing tantalum oxide on the first tantalum oxide layer comprises depositing tantalum oxide on the first tantalum oxide layer to a thickness of about 50 Å or greater in an atmosphere having a temperature in a range from about 460° C. to about 500° C. a pressure greater that or equal to 3 Torr to form a second tantalum oxide layer.

3. A method according to claim 2:
    wherein depositing tantalum oxide on a substrate comprises depositing tantalum oxide on the substrate to a thickness in a range from about 10 Å to about 50 Å; and
    wherein depositing tantalum oxide on the first tantalum oxide layer comprises depositing tantalum oxide on the first tantalum oxide layer to a thickness in a range from about 50 Å to about 100 Å.

4. A method according to claim 3, further comprising:
    annealing the first tantalum oxide layer before depositing the second tantalum oxide layer; and
    annealing the second tantalum oxide layer.

5. A method according to claim 4:
    wherein annealing the first tantalum oxide layer comprises heating the first tantalum oxide layer while exposing the first tantalum oxide layer to oxygen and ultraviolet radiation; and
    wherein annealing the second tantalum oxide layer comprises heating the second tantalum oxide layer while exposing the second tantalum oxide layer to oxygen and ultraviolet radiation.

6. A method according to claim 1, further comprising:
    annealing the first tantalum oxide layer before depositing the second tantalum oxide layer; and
    annealing the second tantalum oxide layer.

7. A method according to claim 6:
    wherein annealing the first tantalum oxide layer comprises heating the first tantalum oxide layer while exposing the first tantalum oxide layer to oxygen and ultraviolet radiation; and
    wherein annealing the second tantalum oxide layer comprises heating the second tantalum oxide layer while exposing the second tantalum oxide layer to oxygen and ultraviolet radiation.

8. A method according to claim 1:
    wherein depositing tantalum oxide on a substrate is preceded by forming a first conductive layer on the substrate;
    wherein depositing tantalum oxide on a substrate comprises depositing tantalum oxide on the conductive layer; and wherein depositing tantalum oxide on the first tantalum oxide layer is followed by forming a second conductive layer on the second tantalum oxide layer.

9. A method according to claim 8, wherein the first and second conductive layers each comprise one of a polycrystalline silicon or a metal.

10. A method according to claim 9, wherein the metal comprises a metal selected from the group comprising ruthenium, platinum and titanium nitride.

11. A method of forming a dielectric region, the method comprising:
depositing tantalum oxide on a substrate at a first deposition rate to a thickness of about 1 Å or greater in a first atmosphere maintained within a first temperature range and/or a first pressure range that produce a first tantalum oxide layer having a step coverage that is not less than 90 percent; and
depositing tantalum oxide on the first tantalum oxide layer in a second atmosphere maintained within a second temperature range and/or a second pressure range that produce a second deposition rate greater than the first deposition rate to form a second tantalum oxide layer on the first tantalum oxide layer.

12. A method according to claim 11, wherein pressures in the second pressure range are greater than pressures in the first pressure range.

13. A method according to claim 11, wherein temperatures in the second temperature range are greater than temperatures in first temperature range.

14. A method according to claim 11:
wherein depositing tantalum oxide on a substrate comprises maintaining the first atmosphere at a temperature in a range from about 350° C. to about 460° C. and/or a pressure in a range from about 0.01 Torr to about 2.0 Torr during formation of the first tantalum oxide layer; and
wherein depositing tantalum oxide on the first tantalum oxide layer comprises maintaining the second atmosphere at a temperature in a range from about 400° C. to about 500° C. and/or a pressure in a range from about 0.1 Torr to about 10.0 Torr during formation of the second tantalum oxide layer.

15. A method according to claim 11:
wherein depositing tantalum oxide on a substrate comprises depositing tantalum oxide such that the first tantalum oxide layer has a thickness in a range from about 1 Å to about 100 Å; and
wherein depositing tantalum oxide on the first tantalum oxide comprises depositing tantalum oxide such that the second tantalum oxide layer has a thickness in a range from about 30 Å to about 300 Å.

16. A method according to claim 11, further comprising:
annealing the first tantalum oxide layer before depositing the second tantalum oxide layer; and
annealing the second tantalum oxide layer.

17. A method according to claim 11:
wherein depositing tantalum oxide on a substrate is preceded by forming a conductive layer on the substrate;
wherein depositing tantalum oxide on a substrate comprises depositing tantalum oxide on the conductive layer; and
wherein depositing tantalum oxide on the first tantalum oxide layer is followed by forming a second conductive layer on the second tantalum oxide layer.

18. A method according to claim 17, wherein the first and second conductive layers each comprise one of a polycrystalline silicon or a metal.

19. A method according to claim 18, wherein the metal comprises a metal selected from the group comprising ruthenium, platinum and titanium nitride.

20. A method of forming a metal oxide layer, comprising:
forming a lower layer on a substrate;
depositing a first metal layer on the lower layer in an atmosphere having a first deposition temperature and a first deposition pressure; and
depositing a second metal oxide layer on the first oxide layer in an atmosphere having a second deposition temperature and a second deposition pressure, wherein the second deposition pressure is higher than the first deposition pressure.

21. The method of claim 20, wherein the lower layer is polycrystalline silicon, and wherein the metal oxide layer is tantalum oxide.

22. The method of claim 21, wherein the first deposition temperature is in a range between about 420° C. and about 460° C.

23. The method of claim 22, further comprising annealing the first metal oxide layer after depositing the first metal oxide layer.

24. The method of claim 23, wherein the steps of depositing the first metal oxide layer and annealing the first metal oxide layer are performed in-situ.

25. The method of claim 21, wherein the first deposition pressure is in a range between about 0.3 Torr and about 3 Torr.

26. The method of claim 25, further comprising annealing the first metal oxide layer after depositing the first metal oxide layer.

27. The method of claim 26, wherein the steps of depositing the first metal oxide layer and annealing the first metal oxide layer are performed in-situ.

28. The method of claim 21, wherein the second deposition temperature is in a range between about 460° C. and about 500° C.

29. The method of claim 28, further comprising annealing the second metal oxide layer after depositing the second metal oxide layer.

30. The method of claim 29, wherein the steps of depositing the second metal oxide layer and annealing the second metal oxide layer are performed in-situ.

31. The method of claim 30, wherein the second deposition pressure is in a range between about 3.0 Torr and about 5.0 Torr.

32. The method of claim 31, further comprising annealing the second metal oxide layer after depositing the second metal oxide layer.

33. The method of claim 32, wherein the steps of depositing the second metal oxide layer and annealing the second metal oxide layer are performed in-situ.

34. The method of claim 20, wherein the lower layer is metal layer, and wherein the metal oxide layer is a tantalum oxide.

35. The method of claim 34, wherein the metal layer comprise one of Ru, Pt, and TiN.

36. The method of claim 34, wherein the first deposition temperature is in a range between about 350° C. and about 450° C.

37. The method of claim 36, further comprising annealing the first metal oxide layer after depositing the first metal oxide layer.

38. The method of claim 34, wherein the first deposition pressure is in a range between about 0.01 Torr and about 2.00 Torr.

39. The method of claim 38, further comprising annealing the first metal oxide layer after depositing the first metal oxide layer.

40. The method of claim 34, wherein the second deposition temperature is in a range between about 400° C. and about 500° C.

41. The method of claim 40, further comprising annealing the second metal oxide layer after depositing the second metal oxide layer.

42. The method of claim 34, wherein the second deposition pressure is in a range between about 0.10 Torr and 10.00 Torr.

43. The method of claim 42, further comprising annealing the second metal oxide layer after depositing the second metal oxide layer.

44. The method of claim 34, wherein the first metal oxide layer has a thickness of about 1 Å to about 100 Å, and the second metal oxide layer has a thickness of about 30 Å to about 300 Å.

* * * * *